(12) United States Patent
Ma et al.

(10) Patent No.: US 12,604,597 B2
(45) Date of Patent: Apr. 14, 2026

(54) PEROVSKITE SOLAR CELL AND MANUFACTURING METHOD

(71) Applicant: Hubei Wonder SOLAR Limited Liability Company, Wuhan (CN)

(72) Inventors: Yongming Ma, Wuhan (CN); Xiayan Chen, Wuhan (CN); Youyu Jiang, Wuhan (CN); Yusong Sheng, Wuhan (CN)

(73) Assignee: Hubei Wonder SOLAR Limited Liability Company, Wuhan (CN)

( * ) Notice: Subject to any disclaimer, the term of this patent is extended or adjusted under 35 U.S.C. 154(b) by 0 days.

(21) Appl. No.: 18/821,949

(22) Filed: Aug. 30, 2024

(65) Prior Publication Data

US 2024/0431125 A1    Dec. 26, 2024

(30) Foreign Application Priority Data

Sep. 11, 2023    (CN) .......................... 202311162681.7

(51) Int. Cl.
*H10K 30/40*      (2023.01)
*C07F 19/00*      (2006.01)
*H10K 71/20*      (2023.01)
*H10K 85/50*      (2023.01)

(52) U.S. Cl.
CPC ........... *H10K 30/40* (2023.02); *C07F 19/005* (2013.01); *H10K 71/211* (2023.02); *H10K 85/50* (2023.02)

(58) Field of Classification Search
CPC ...... H10K 30/40; H10K 71/211; H10K 85/50; H10K 30/151; H10K 30/50; H10K 71/13; H10K 71/00; C07F 19/005; Y02E 10/549
See application file for complete search history.

(56) References Cited

U.S. PATENT DOCUMENTS

2016/0111575 A1*   4/2016   Han ........................ H10K 85/50
                                                      136/258
2016/0380125 A1*  12/2016   Snaith .................... H10K 85/00
                                                      136/256
2022/0122782 A1    4/2022   Jung et al.
2024/0023351 A1    1/2024   Yu et al.
2024/0206195 A1    6/2024   Yeom

OTHER PUBLICATIONS

Xia ("Reduced Confinement Effect by Isocyanate Passivation for Efficient Sky-Blue Perovskite Light-Emitting Diodes") Adv. Funct. Mater. 2022, 32, 2208538 (Year: 2022).*

* cited by examiner

*Primary Examiner* — Angelo Trivisonno

(57) ABSTRACT

The present disclosure provides a perovskite solar cell and a manufacturing method. The method includes: providing a substrate; forming a functional layer on the substrate; forming a perovskite crystal in the functional layer; providing a postprocessing solution including a solvent and an isocyanates compound; applying the postprocessing solution to the perovskite crystal, and maintaining the postprocessing solution for a predetermined time period under a predetermined condition, so as to remove the solvent for complete reaction. According to the present disclosure, it is able to optimize the performance of the perovskite solar cell and improve the photoelectric conversion efficiency.

3 Claims, 20 Drawing Sheets

Fig. 20

PEROVSKITE SOLAR CELL AND MANUFACTURING METHOD

CROSS-REFERENCE TO RELATED APPLICATIONS

This application claims priority to Chinese Patent Application No. 202311162681.7 with a filing date of Sep. 11, 2023. The content of the aforementioned application, including any intervening amendments thereto, is incorporated herein by reference in its entirety.

TECHNICAL FIELD

The present disclosure relates to the field of solar cell technology, in particular to a perovskite solar cell and a method for manufacturing the perovskite solar cell.

BACKGROUND

Efficiency and stability of a perovskite solar cell are limited by its harmful defects. Usually, a perovskite thin film manufactured through a solution method includes a huge amount of grain boundaries, and such defects as dislocation, impurities and vacancy defects formed due to broken chemical bonds easily occur at the grain boundaries.

The grain boundary refers to an interface between grains which have a same structure and different orientations. During the crystallization, the grains grow continuously, and such a transition state as grain boundary is formed between adjacent grains. At the grain boundary, the arrangement of atoms is changed from one orientation to another orientation, i.e., the atoms at the grain boundary are in the transition state. For a polycrystalline solar cell, a transportation characteristic of carriers at the grain boundary is seriously adversely affected, and thereby the performance of the solar cell is adversely affected.

For a flat-panel perovskite solar cell, a wide band-gap material, e.g., lead iodide or low-dimensional perovskite, and a material having a capability of coordinating with lead, e.g., a polymer, are commonly used as passivation materials, and they may also be used in, but not completely applicable to, the perovskite solar cell. As a most important reason, for photoelectric devices where the carriers are transferred longitudinally, the carriers in the flat-panel perovskite solar cell do not need to pass through the grain boundary, while the carriers in the perovskite solar cell needs to pass through the grain boundary.

SUMMARY

An object of the present disclosure is to provide a perovskite solar cell and a manufacturing method thereof, so as to improve the performance of the perovskite solar cell, and increase the photoelectric conversion efficiency.

In order to solve the above-mentioned technical problem, the present disclosure provides the following technical solutions.

In one aspect, the present disclosure provides in some embodiments a method for manufacturing a perovskite solar cell, including: providing a substrate; forming a functional layer on the substrate; forming a perovskite crystal in the functional layer; providing a postprocessing solution including a solvent and an isocyanates compound; and applying the postprocessing solution to the perovskite crystal, and maintaining the postprocessing solution for a predetermined time period under a predetermined condition, so as to remove the solvent for complete reaction.

In a possible embodiment of the present disclosure, the isocyanates compound is one or more selected from the group consisting of hexamethylene diisocyanate, toluene diisocynate, polyphenyl polymethylene polyisocyanate, isophorone diisocyanate and 2,4-difluorophenyl isocyanate.

In a possible embodiment of the present disclosure, a volume concentration of the isocyanates compound in the postprocessing solution is 10 μl/ml to 50 μl/ml.

In a possible embodiment of the present disclosure, the solvent of the postprocessing solution is an organic solvent including nitriles, benzenes or ethers.

In a possible embodiment of the present disclosure, the maintaining the postprocessing solution for the predetermined time period under the predetermined condition includes maintaining the prostprocessing solution for 1 minute to 10 minutes at a temperature of 25° C. to 150° C.

In a possible embodiment of the present disclosure, the perovskite crystal includes $ABX_3$, where A is one or more selected from the group consisting of formamidinyl (FA), methylamino (MA) and $C_s$, B is one or more selected from the group consisting of Pb and Sn, and X is halogen.

In a possible embodiment of the present disclosure, a solution for forming the perovskite crystal is a perovskite precursor solution, the perovskite precursor solution is obtained through adding MAI, FAI, CsI, $PbI_2$ and MACl into an aprotic solvent, and the aprotic solvent is one or more selected from the group consisting of DMF and DMSO.

In a possible embodiment of the present disclosure, the forming the perovskite crystal includes: providing a perovskite precursor solution, the perovskite precursor solution being obtained through adding at least one of MAX, FAX or CsX and at least one of $PbX_2$ or $SnX_2$ into a solvent; applying the perovskite precursor solution to the functional layer to form a wet perovskite film; and curing the wet perovskite film to form the perovskite crystal.

In a possible embodiment of the present disclosure, a mesoporous electron transport layer is made of one or more materials selected from the group consisting of $TiO_2$, $SnO_2$, ZnO, $BaSnO_3$ and $SrTiO_3$, a mesoporous interlayer is made of one or more materials selected from the group consisting of $ZrO_2$, $SiO_2$, $Al_2O_3$ and $BaTiO_3$, and a mesoporous counter electrode layer is made of carbon.

In another aspect, the present disclosure provides in some embodiments a perovskite solar cell manufactured through the above-mentioned method, the perovskite solar cell including: a substrate; a conductive layer arranged on the substrate; a dense layer arranged on the conductive layer; and a mesoporous layer arranged on the dense layer, and including a mesoporous electron transport layer, a mesoporous interlayer and a mesoporous counter electrode layer laminated one on another on the dense layer.

The present disclosure at least has the following beneficial effects. According to the perovskite solar cell and the manufacturing method thereof, the perovskite crystal is postprocessed through the isocyanates compound, so as to improve the performance of the perovskite solar cell. A specific principle will be described as follows. Through the in-situ reaction of the isocyanates compound at a surface/interface, it is able to smooth a bulk-phase surface potential of a perovskite crystal, change a type of a grain boundary, enhance a transportation capability of carriers at the grain boundary and a bulk phase, and attenuate the nonradiative recombination. A product of the in-situ reaction has radicals containing a lone electron pair, e.g., aminocarbonyl, and these radicals coordinate with lead in the perovskite crystal, so as to passivate an iodine vacancy defect, attenuate the nonradiative recombination, and enable an iodine vacancy to change from zero valence to monovalence. Due to the change in a valence state of the iodine vacancy, bound electrons in the grain boundary are converted into free carriers, so as to contribute to a current in a circuit of a device. In terms of the degradation stability, the product of the in-situ reaction occupies and passivates a weak degradation site, so it is able to improve the long-term stability of the perovskite solar cell.

BRIEF DESCRIPTION OF THE DRAWINGS

FIG. 20 is a reaction process diagram of the TDI and FAI theories.

DETAILED DESCRIPTION

Figure 1:
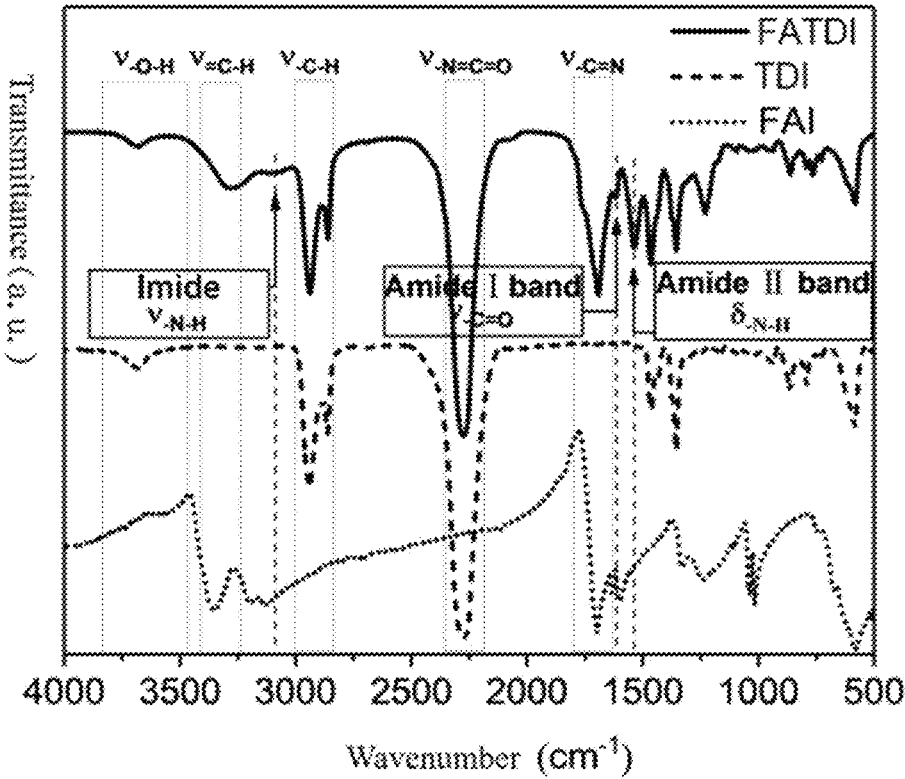
FIG. 1 is a Fourier Transform Infrared (FT-IR) spectrogram of FATDI, TDI and FAI.

The present disclosure will be described hereinafter in conjunction with the drawings and embodiments. The following embodiments are for illustrative purposes only, but shall not be used to limit the scope of the present disclosure. Actually, the embodiments are provided so as to facilitate the understanding of the scope of the present disclosure.

The present disclosure provides in some embodiments a method for manufacturing a perovskite solar cell, which includes: providing a substrate; forming a functional layer on the substrate; forming a perovskite crystal in the functional layer; providing a postprocessing solution including a solvent and an isocyanates compound; applying the postprocessing solution to the perovskite crystal, and maintaining the postprocessing solution for a predetermined time period under a predetermined condition, so as to remove the solvent for complete reaction.

In a possible embodiment of the present disclosure, the isocyanates compound is one or more selected from the group consisting of hexamethylene diisocyanate, toluene diisocynate, polyphenyl polymethylene polyisocyanate, isophorone diisocyanate and 2,4-difluorophenyl isocyanate.

In the embodiments of the present disclosure, the isocyanates compound is toluene diisocyanate (TDI). Toluene diisocyanate (TDI) is a bifunctional aliphatic isocyanates substance. Due to a conjugated double bond type of N=C=O in an isocyanate group and the electronegativity of the atoms N and O at two sides, the atom C in the middle is changed into a carbocation and becomes an electrophilic center, so an electrophilic addition reaction may occur.

Taking a printable mesoscopic formamidine-based perovskite solar cell as an example, active hydrogen of formamidine in the grain boundary may attach the carbocation in the isocyanate group, so as to generate FATDI through reaction (which will be described hereinafter in details). In this regard, it is able to level a potential for the in-situ reaction of the perovskite in the grain boundary and meanwhile improve the passivation and stability of the grain boundary through the product of the reaction.

In a possible embodiment of the present disclosure, a volume concentration of the isocyanates compound in the postprocessing solution is 10 μl/ml to 50 μl/ml, e.g., 10 μl/ml, 20 μl/ml, 30 μl/ml, 40 μl/ml or 50 μl/ml.

In a possible embodiment of the present disclosure, the solvent of the postprocessing solution is an organic solvent including nitriles, benzenes or ethers. For example, the solvent is chlorobenzene.

In a possible embodiment of the present disclosure, the applying the postprocessing solution to the perovskite crystal includes dripping the isocyanates compound dissolved in a chlorobenzene solution to a device with the perovskite crystal, annealing and drying the device, and then cooling the device to obtain the perovskite solar cell.

In a possible embodiment of the present disclosure, the postprocessing solution is a chlorobenzene solution of TDI.

In a possible embodiment of the present disclosure, a concentration of TDI in the postprocessing solution is 1 μl/ml to 500 μl/ml. The postprocessing solution is dripped onto a standard device of the perovskite solar cell for multiple times. Along with an increase in the concentration of TDI, the efficiency of the device is positively correlated to the concentration of TDI, and when the efficiency reaches a maximum value and the concentration of TDI increases continuously, an excessive surface/interface reaction occurs. At this time, the efficiency of the device is negatively correlated to the concentration of TDI, i.e., the transfer of charges is blocked due to the excessive reaction. Identical to the concentration mechanism, the postprocessing solution is dripped for multiple times so as to prevent the occurrence of the excessive reaction.

In a possible embodiment of the present disclosure, the perovskite crystal includes $ABX_3$, where A is one or more selected from the group consisting of formamidinyl (FA), methylamino (MA) and $C_s$, B is one or more selected from the group consisting of Pb and Sn, and X is halogen.

In a possible embodiment of the present disclosure, the forming the perovskite crystal includes: providing a perovskite precursor solution, the perovskite precursor solution being obtained through adding at least one of MAX, FAX or CsX and at least one of $PbX_2$ or $SnX_2$ into a solvent; applying the perovskite precursor solution to the functional layer to form a wet perovskite film; and curing the wet perovskite film to form the perovskite crystal.

In some embodiments of the present disclosure, the perovskite precursor solution is obtained through adding MAI, FAI, CsI, $PbI_2$ and MACl, at a molar ratio of 0.15:0.8:0.05:1:0.2, into DMF and DMSO.

In the embodiments of the present disclosure, concentrations of MAI, FAI, CsI, $PbI_2$ and MACl are 0.15 mol/L, 0.8 mol/L, 0.05 mol/L, 1 mol/L and 0.2 mol/L respectively.

In the embodiments of the present disclosure, the perovskite precursor solution is a ternary mixed-cation perovskite precursor solution, where MAI is methylammonium iodide, FAI is formamidine iodide, CsI is cesium iodide, $PbI_2$ is lead iodide, MACl is methylammonium chloride, DMF is dimethylformamide, and DMSO is dimethyl sulfoxide. A surfactant is easily adsorbed at an interface between two phases having different polarities, and a hydrophobic structure of the surfactant exhibits excellent affinity with a carbonaceous material in a cathode, so the dense surfactant molecules may function as a protection layer to isolate the cathode from an electrolyte, so as to suppress the side reaction of the cathode with the electrolyte during the charging/discharging, thereby to improve the performance of the cell. The aprotic polar solvent has an extremely weak autoprotolysis reaction or does not show any tendency to autoprotolysis. DMF and DMSO are aprotic polar solvents, and molecules of the aprotic polar solvent has polarity, so molecules of a solute are adversely affected and a solvation effect may occur. Due to the aprotic polar solvent, a cation, especially a metal cation, is solvated. In addition, this kind of solvent itself is difficult to provide protons, so it is able to stabilize ions.

In a possible embodiment of the present disclosure, the forming the functional layer on the substrate includes: forming a conductive layer on the substrate; forming a dense layer on the conductive layer; and forming a mesoporous layer on the dense layer, the mesoporous layer including a mesoporous electron transport layer, a mesoporous interlayer and a mesoporous counter electrode layer one on another on the dense layer.

In the embodiments of the present disclosure, the dense layer is deposited on the conductive layer through spray pyrolysis at a temperature of 450° C. A solution for the spray pyrolysis is an isopropanol solution containing $TiCl_4$, and a mass ratio of the isopropanol solution to $TiCl_4$ is 4:1 to 12:1, e.g., 8:1.

In a possible embodiment of the present disclosure, the mesoporous electron transport layer is made of one or more materials selected from the group consisting of $TiO_2$, $SnO_2$, ZnO, $BaSnO_3$ and $SrTiO_3$, the mesoporous interlayer is made of one or more materials selected from the group consisting of $ZrO_2$, $SiO_2$, $Al_2O_3$ and $BaTiO_3$, and the mesoporous counter electrode layer is made of one or more materials selected from the group consisting of carbon, ITO and FTO.

In the embodiments of the present disclosure, for example, the mesoporous electron transport layer is made of $TiO_2$, and the mesoporous interlayer is made of $ZrO_2$.

The present disclosure further provides in some embodiments a perovskite solar cell manufactured through the above-mentioned method. The perovskite solar cell includes: a substrate; a conductive layer arranged on the substrate; a dense layer arranged on the conductive layer; and a mesoporous layer arranged on the dense layer, and including a mesoporous electron transport layer, a mesoporous interlayer and a mesoporous counter electrode layer laminated one on another on the dense layer.

The present disclosure will be described hereinafter in conjunction with the drawings and embodiments. The following embodiments are for illustrative purposes only, but shall not be used to limit the scope of the present disclosure. Where no technique or condition is specified, the known technique or condition, or that specified in a product manual, may be applied. Where no manufacturer of a reagent or instrument is specified, the market-available reagent or instrument may be applied.

First Embodiment

Validation of a resultant of the reaction of TDI with FAI

Figure 20:
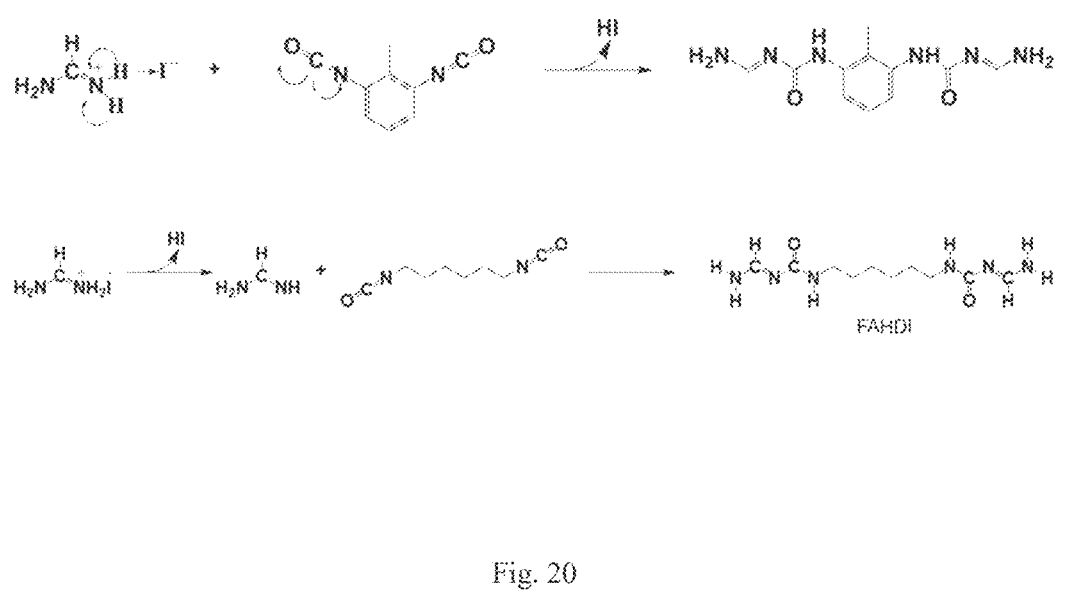

As shown in FIG. 20, TDI is mixed with FAI, theoretically, the chemical reaction as illustrated in FIG. 20 will occur.

For the validation, the following test is performed.

(1) FT-IR: TDI, FAI and a resultant FATDI of the reaction of TDI with FAI are subjected to an FT-IR test, and FIG. 1 shows an obtained FT-IR spectrogram.

As shown in FIG. 1, new peaks occur for FATDI at wavenumbers of 3100 $cm^{-1}$, 1615 $cm^{-1}$ and 1536 $cm^{-1}$, where the peak at the wavenumber of 3100 $cm^{-1}$ is an amine peak of secondary amine, the peak at the wavenumber of 1615 $cm^{-1}$ is a stretching vibration peak of carbonyl of an amide I band, and the peak at the wavenumber of 1536 $cm^{-1}$ is an in-plane rocking peak of an N—H bond of an amide II band.

(2) $^1$H-NMR: TDI, FAI and the resultant FATDI of the reaction of TDI with FAI are subjected to an $^1$H-NMR test, and FIG. 2 shows an obtained $^1$H-NMR spectrogram.

Figure 2:
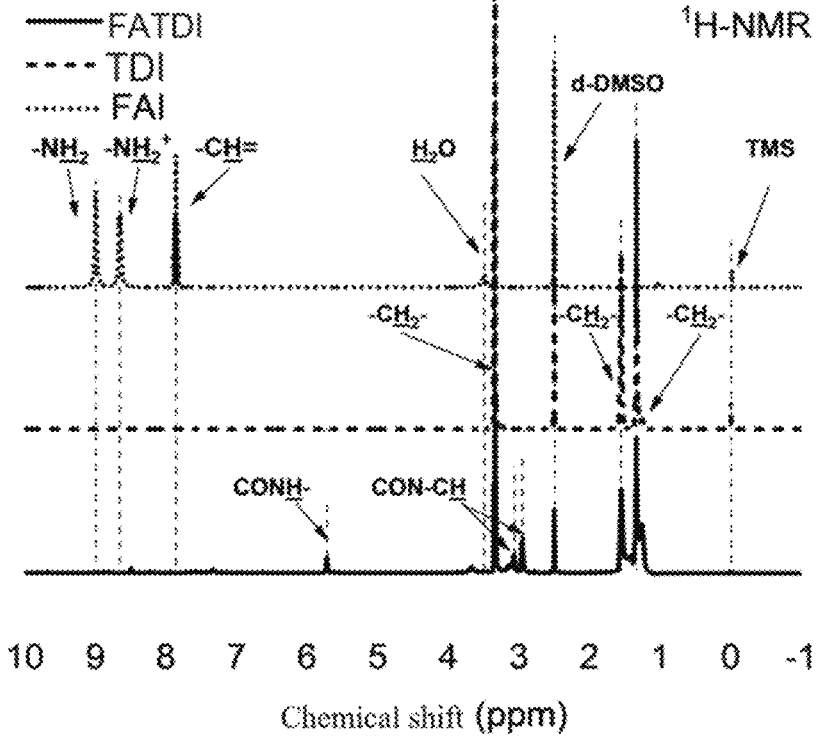
FIG. 2 is a Hydrogen Nuclear Magnetic Resonance ($^1$H-NMR) spectrogram of FATDI, TDI and FAI.

As shown in FIG. 2, for the $^1$H-NMR of FATDI, new peaks occur at chemical shifts of 5.8 ppm and 2.9 ppm, where the peak at the chemical shift of 5.8 ppm is an N—H peak of amide, and the peak at the chemical shift of 2.9 ppm is a C—H peak of amide connected to nitrogen.

The above-mentioned tests show that, the resultant of the reaction of TDI with FAI is indeed what shown by the above chemical equation.

Second Embodiment

Figure 3:
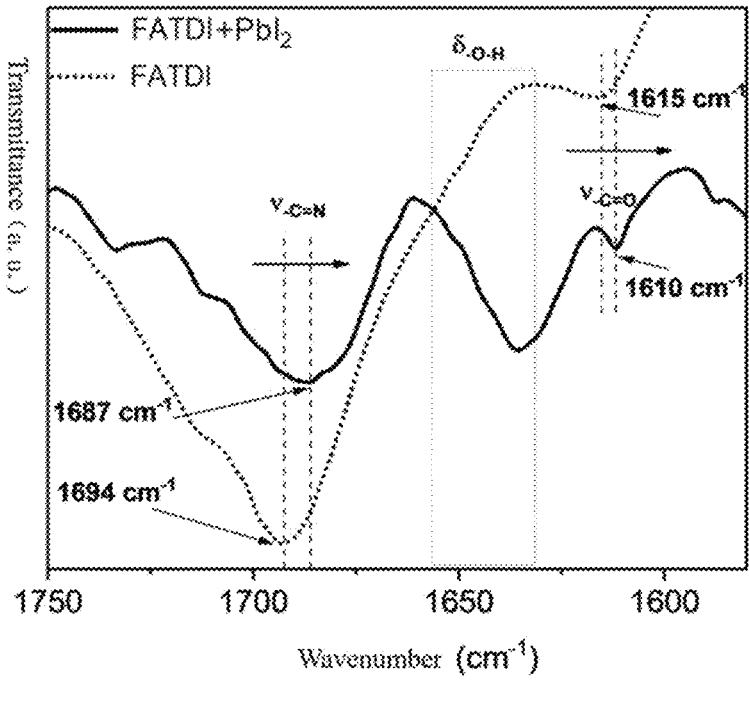
FIG. 3 is an FT-IR spectrogram of FATDI and a mixture of FATDI and $PbI_2$.
Figure 4:
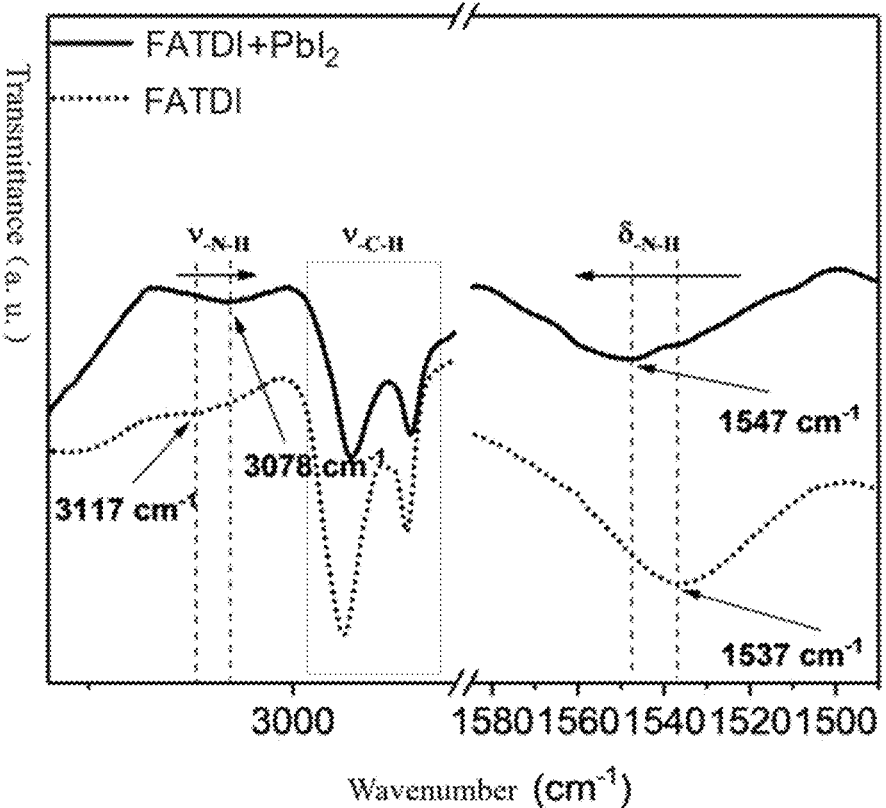
FIG. 4 is another FT-IR spectrogram of FATDI and the mixture of FATDI and $PbI_2$.

Validation of interaction between the resultant of the reaction of TDI with FAI and a specific functional group (1) FATDI and a mixture of FATDI and $PbI_2$ are subjected to an FT-IR test, and FIGS. 3 and 4 show the obtained FT-IR spectrograms.

As shown in FIGS. 3 and 4, carbonyl of FATDI which should have been located at the wavenumber of 1615 $cm^{-1}$ moves to be at the wavenumber of 1610 $cm^{-1}$, i.e., a carbonyl peak moves to a low wavenumber, which shows the coordination of carbonyl with lead.

In addition, the stretching vibration peak of secondary amine in FATDI which should have been located at the wavenumber of 3078 $cm^{-1}$ moves to be at the wavenumber of 3117 cm$^{-1}$, and a bending vibration peak which should have been located at the wavenumber of 1547 cm$^{-1}$ moves to be at the wavenumber of 1537 cm$^{-1}$, which shows the formation of a hydrogen bond between hydrogen of secondary amine in FATDI with lead of lead iodide.

Figure 5:
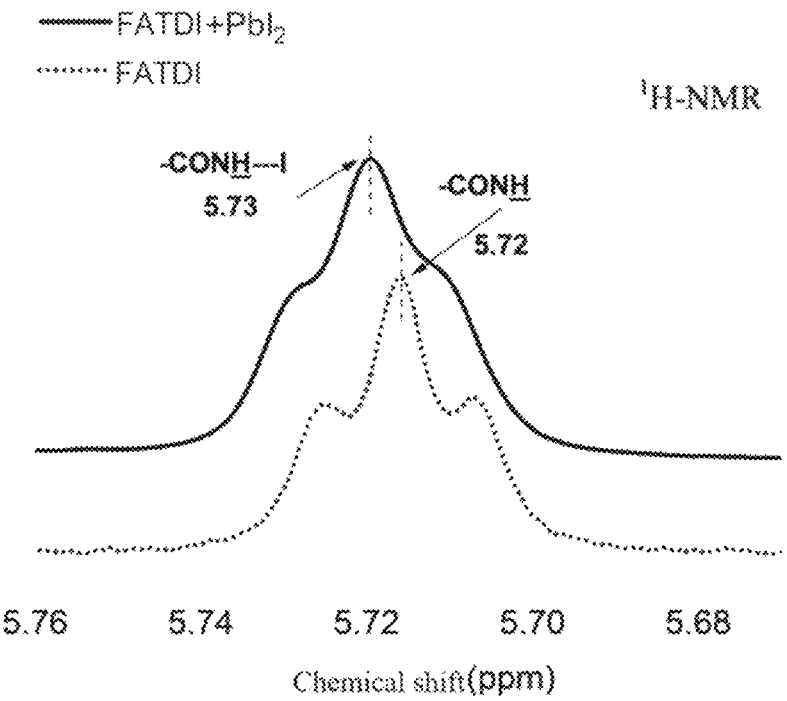
FIG. 5 is an $^1$H-NMR spectrogram of FATDI and the mixture of FATDI and $PbI_2$.

(2) FATDI and the mixture of FATDI and PbI$_2$ are subjected to an H-NMR test, and FIG. 5 shows the obtained H-NMR spectrogram. As shown in FIG. 5, in the H-NMR spectrogram, hydrogen of secondary amine in FATDI which should have been located at the chemical shift of 5.72 ppm moves to a low field to be at the chemical shift of 5.73 ppm, which further shows the formation of the hydrogen bond between hydrogen of secondary amine in FATDI with lead of lead iodide.

Figure 6:
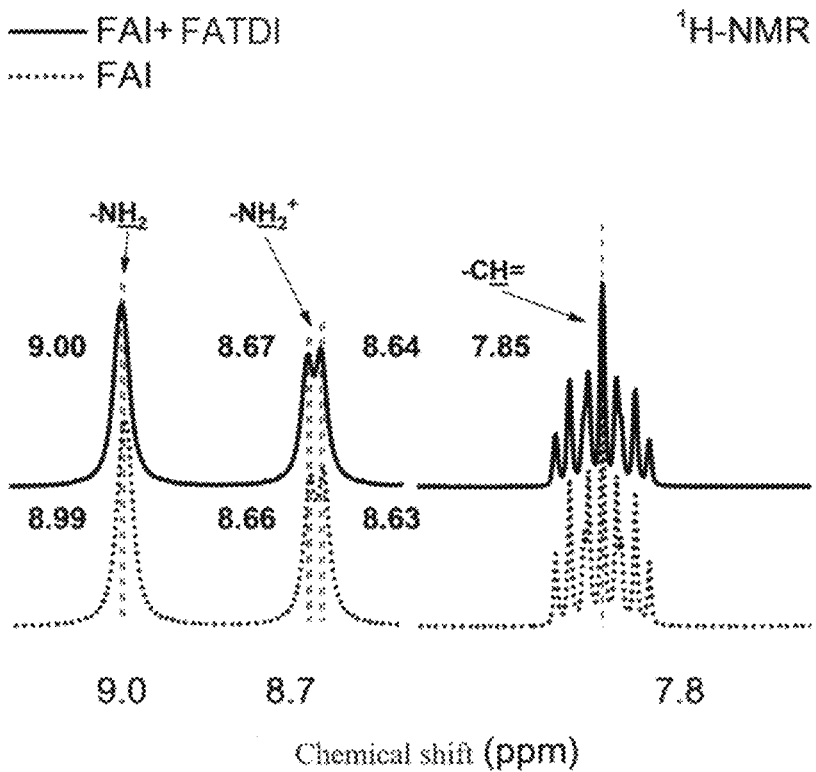
FIG. 6 is an $^1$H-NMR spectrogram of FAI and a mixture of FATDI and FAI.

(3) FAI and the mixture of FATDI and FAI are subjected to an H-NMR test, and FIG. 6 shows the obtained H-NMR spectrogram.

As shown in FIG. 6, an amine peak of FAI moves to a low field, which shows a hydrogen-bond interaction between the carbonyl peak of FATDI and amine in FA.

The above-mentioned tests show the coordination of FATDI with lead, and the hydrogen-bond interaction between FATDI with iodine and amine. Hence, when the perovskite includes FATDI, FATDI interacts with atoms or functional groups at sites A, B and C of the perovskite material, so as to improve the performance of the perovskite, which will be described hereinafter.

Third Embodiment

Perovskite including $Cs_{0.05}MA_{0.15}FA_{0.5}PbI_3$ is formed on an FTO glass substrate, so as to obtain a perovskite substrate (Control1).

Perovskite including $Cs_{0.05}MA_{0.15}FA_{0.5}PbI_3$ is formed on an FTO glass substrate, and postprocessed with TDI, so as to obtain an TDI-processed perovskite substrate (Target1).

(1) The perovskite substrate and the TDI-processed perovskite substrate are subjected to an X-ray photoelectron spectroscopy test.

Figure 7:
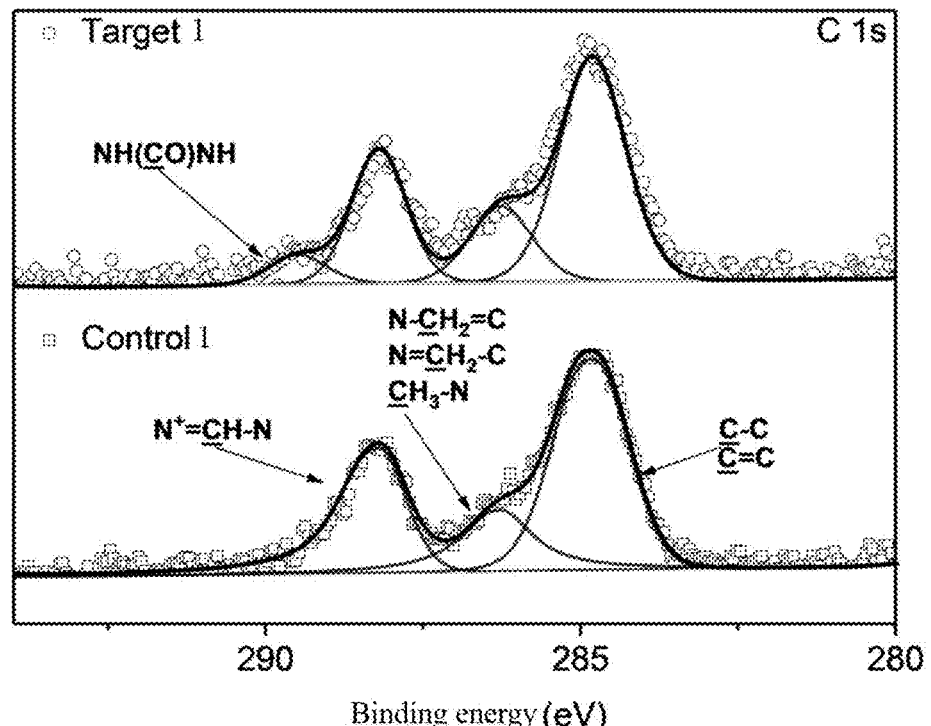
FIG. 7 is a carbon spectrogram of a perovskite substrate and an TDI-processed perovskite substrate measured through X-ray photoelectron spectroscopy.
Figure 8:
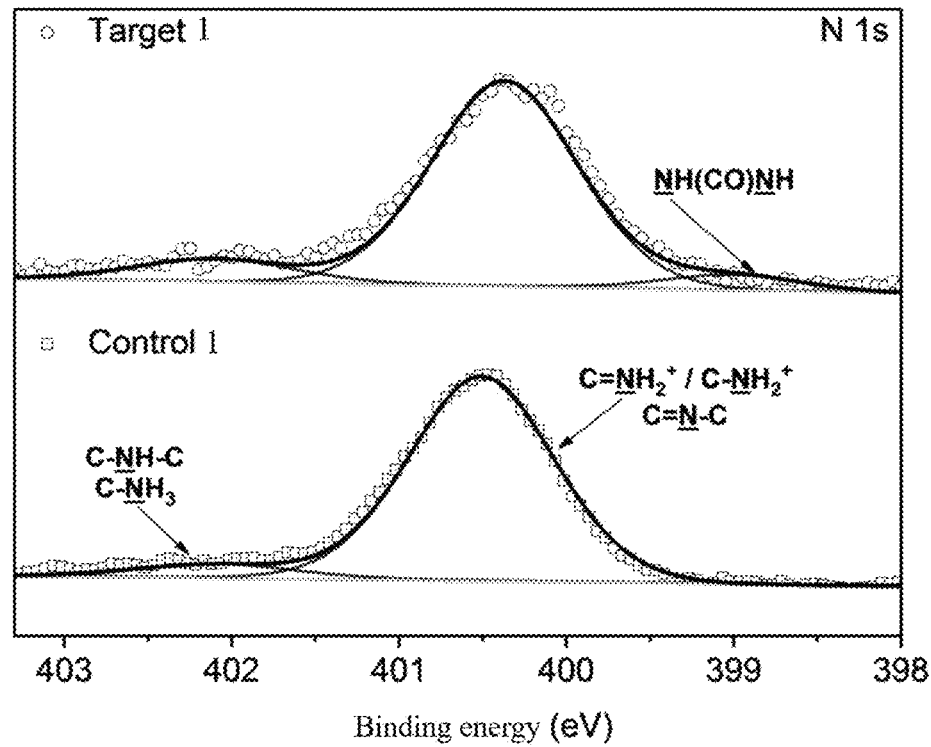
FIG. 8 is a nitrogen spectrogram of the perovskite substrate and the TDI-processed perovskite substrate measured through X-ray photoelectron spectroscopy.

FIG. 7 shows the obtained carbon spectrogram. As shown in FIG. 7, a new peak occurs at 289 eV, and it is determined that this peak is a carbonyl peak of FATDI. FIG. 8 shows the obtained nitrogen spectrogram. As shown in FIG. 8, a new peak occurs at 399 eV, and it is determined that this peak is a secondary amine peak of FATDI. Hence, when the perovskite is postprocessed with TDI, TDI may react with a small amount of residual FAI in the perovskite to generate FATDI with the above-mentioned structural formula.

Figure 9:
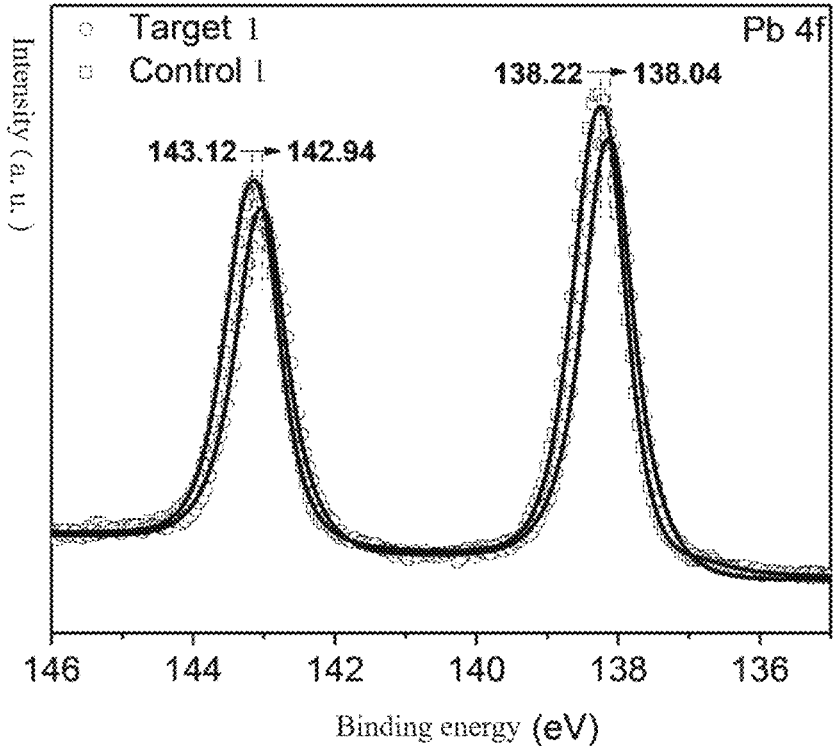
FIG. 9 is a lead spectrogram of the perovskite substrate and the TDI-processed perovskite substrate measured through X-ray photoelectron spectroscopy.
Figure 10:
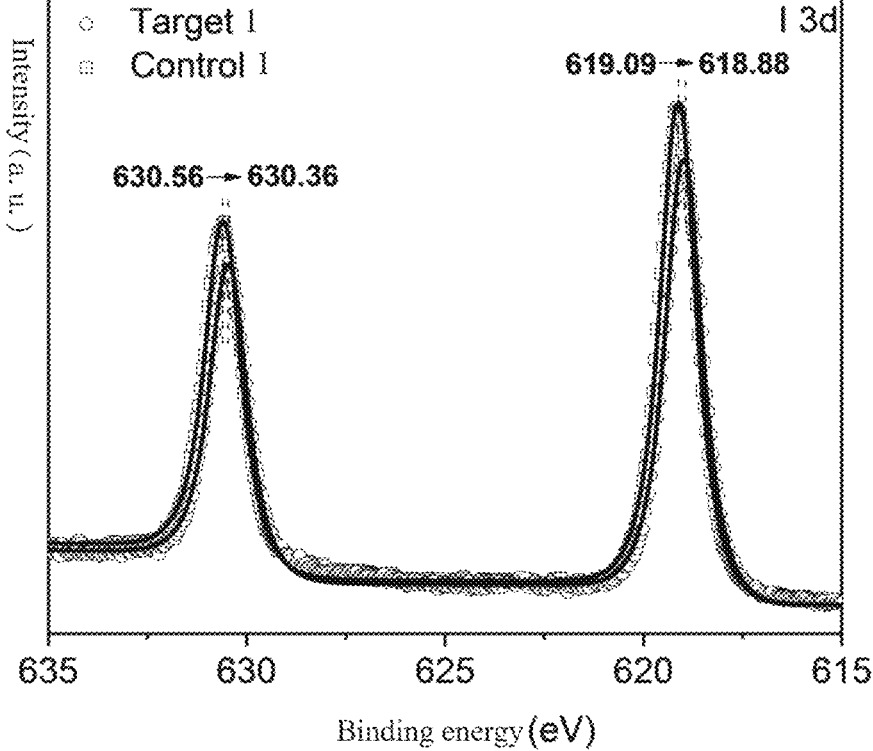
FIG. 10 is an iodine spectrogram of the perovskite substrate and the TDI-processed perovskite substrate measured through X-ray photoelectron spectroscopy.

In addition, FIG. 9 shows the obtained lead spectrogram. As shown in FIG. 9, 4f5/2 and 4f7/2 peaks of lead each move to a position of low binding energy. FIG. 10 shows the obtained iodine spectrogram. As shown in FIG. 10, 3d3/2 and 3d5/2 peaks of iodine each move to a position of low binding energy. The above should be caused by the coordination of the in-situ resultant of the postprocessing, i.e., FATDI, with lead and the hydrogen-bond interaction between FATDI with iodine.

(2) The perovskite substrate and the TDI-processed perovskite substrate are subjected to an Atomic Force Microscope (AFM) test and a Kelvin Probe Force Microscope (KPFM) test.

Figure 11:
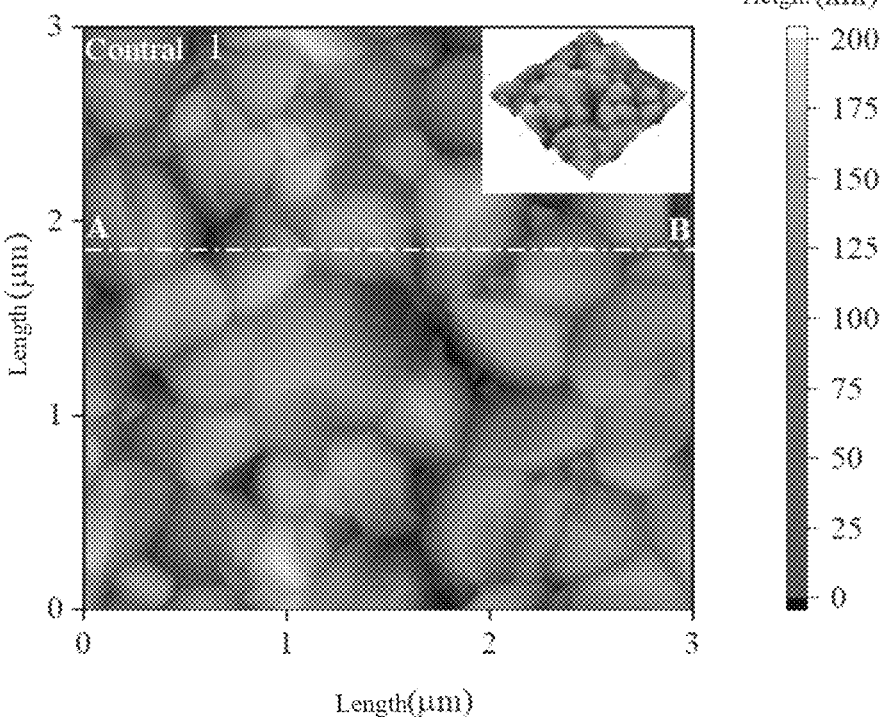
FIG. 11 is a graph showing surface morphology of the perovskite substrate characterized by AFM.
Figure 12:
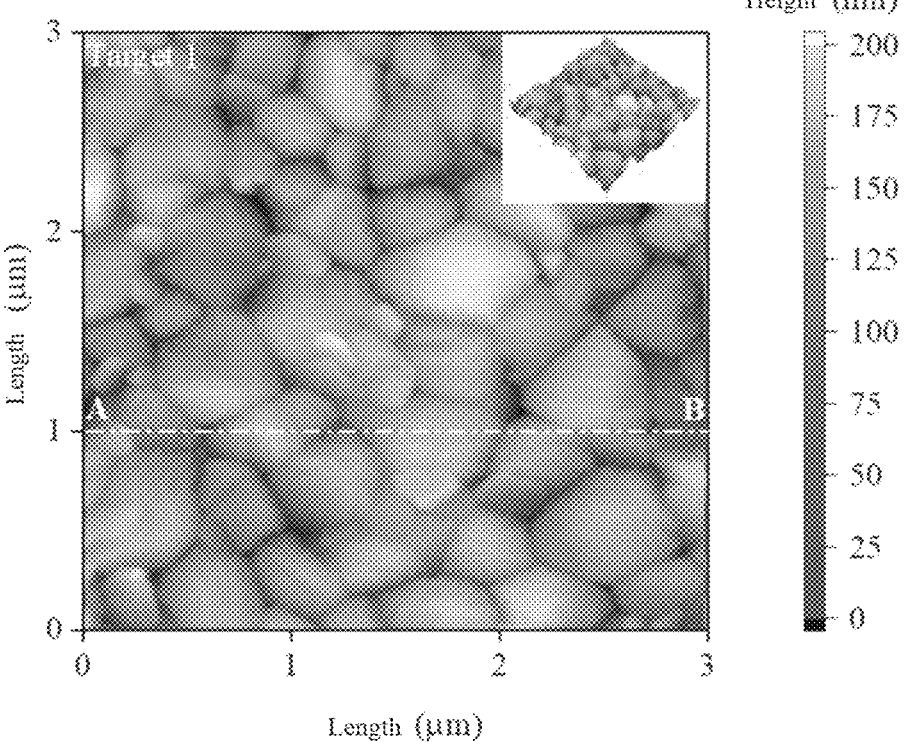
FIG. 12 is a graph showing surface morphology of the TDI-processed perovskite substrate characterized by AFM.
Figure 13:
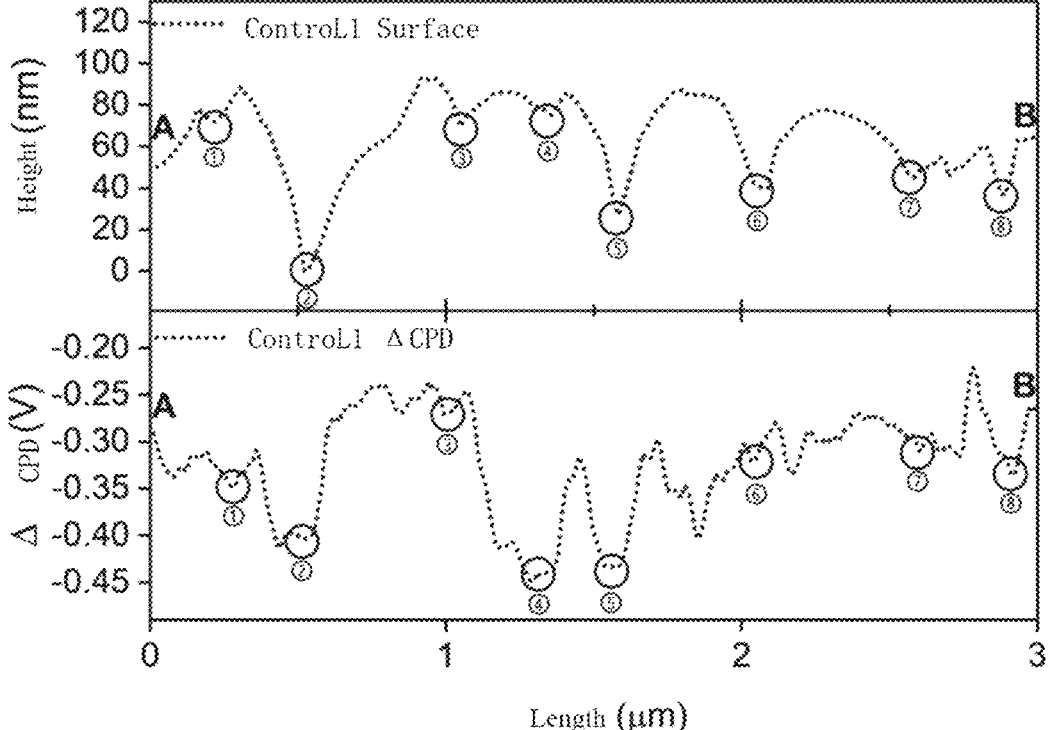
FIG. 13 is a graph showing surface morphology and surface potential distribution of the perovskite substrate.
Figure 14:
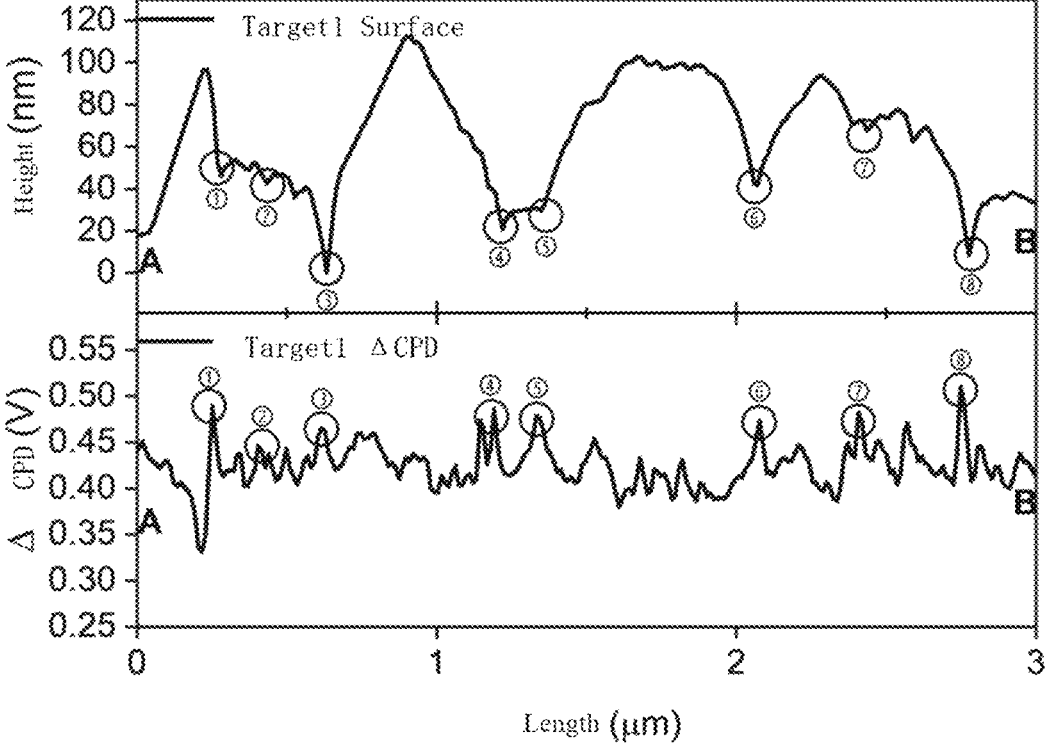
FIG. 14 is a graph showing surface morphology and surface potential distribution of the TDI-processed perovskite substrate.

FIG. 11 shows surface morphology of the perovskite substrate characterized by AFM, and FIG. 12 shows surface morphology of the TDI-processed perovskite substrate characterized by AFM. The surface morphology of the perovskite substrate and the surface potential distribution thereof are fitted to one graph, as shown in FIG. 13, and the surface morphology of the TDI-processed perovskite substrate and the surface potential distribution thereof are fitted to one graph, as shown in FIG. 14.

Based on the above-mentioned testing results, as compared with the non-processed perovskite, the surface potential distribution of the TDI-processed perovskite layer is more even, and a potential at the grain boundary is closer to a potential at the bulk phase, which means that the potential transition between the bulk phase and the grain boundary is smooth and thereby the carrier's capability of passing through the grain boundary is increased.

Fourth Embodiment

A mesoporous titanium dioxide layer is formed on a glass substrate, and perovskite including $Cs_{0.05}MA_{0.15}FA_{0.8}PbI_3$ is formed in a mesoporous structure of the mesoporous titanium dioxide layer, so as to obtain a mesoporous titanium dioxide perovskite substrate (Control2).

A mesoporous titanium dioxide layer is formed on a glass substrate, and perovskite including $Cs_{0.05}MA_{0.15}FA_{0.5}PbI_3$ is formed in a mesoporous structure of the mesoporous titanium dioxide layer, and then postprocessed with TDI, so as to obtain a TDI-processed mesoporous titanium dioxide perovskite substrate (Target2).

A mesoporous zirconium dioxide layer is formed on a glass substrate, and perovskite including $Cs_{0.05}MA_{0.15}FA_{0.8}PbI_3$ is formed in a mesoporous structure of the mesoporous zirconium dioxide layer, so as to obtain a mesoporous zirconium dioxide perovskite substrate (Control3).

A mesoporous zirconium dioxide layer is formed on a glass substrate, and perovskite including $Cs_{0.05}MA_{0.15}FA_{0.5}PbI$ is formed in a mesoporous structure of the mesoporous zirconium dioxide layer, and then postprocessed with TDI, so as to obtain a TDI-processed mesoporous zirconium dioxide perovskite substrate (Target3).

Figure 15:
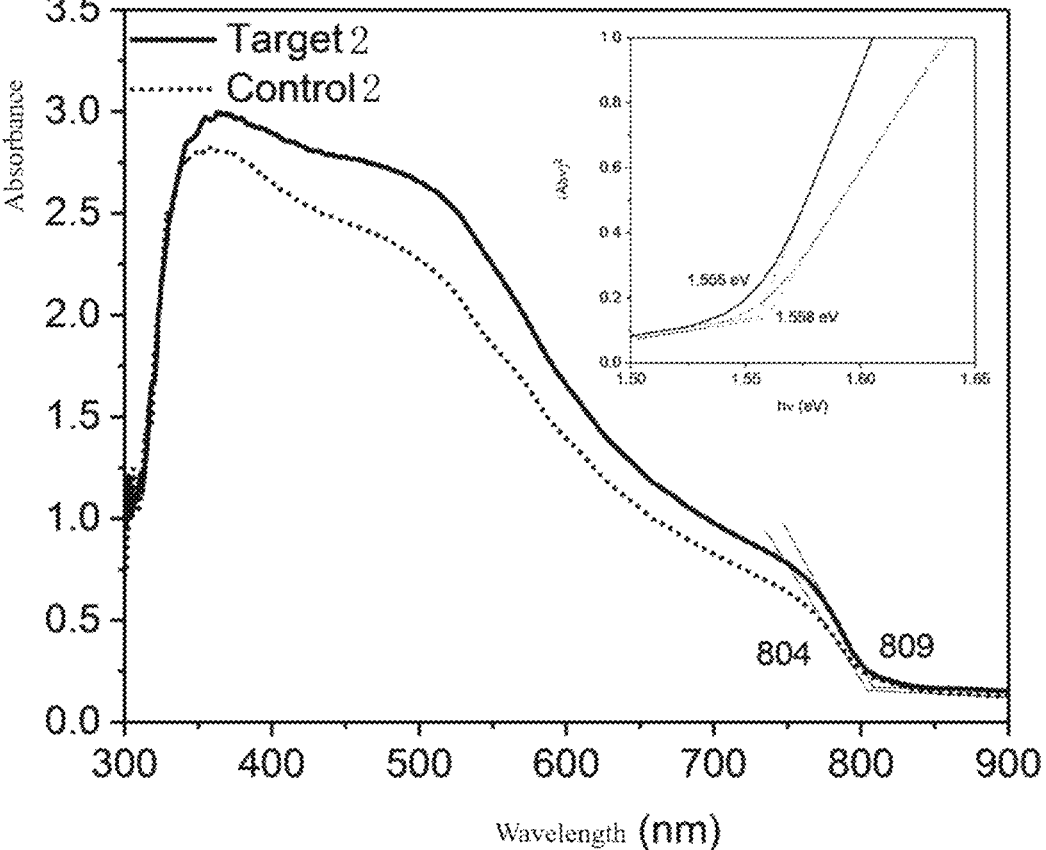
FIG. 15 is a UV-vis spectrogram of a mesoporous $TiO_2$ perovskite substrate and a TDI-processed mesoporous $TiO_2$ perovskite substrate.

(1) The mesoporous titanium dioxide perovskite substrate and the TDI-processed mesoporous titanium dioxide perovskite substrate are subjected to a UV-vis test, as shown in FIG. 15. Through comparing the UV-vis absorption spectrogram of the mesoporous titanium dioxide perovskite substrate with that of the TDI-processed mesoporous titanium dioxide perovskite substrate, it is found that the absorbance of the TDI-processed perovskite increases, i.e., it is able to increase the absorbance of the perovskite layer through processing the perovskite with TDI.

(2) The mesoporous titanium dioxide perovskite substrate, the TDI-processed mesoporous titanium dioxide perovskite substrate, the mesoporous zirconium dioxide perovskite substrate and the TDI-processed mesoporous zirconium dioxide perovskite substrate are subjected to a fluorescence intensity and fluorescence lifetime test.

Figure 16:
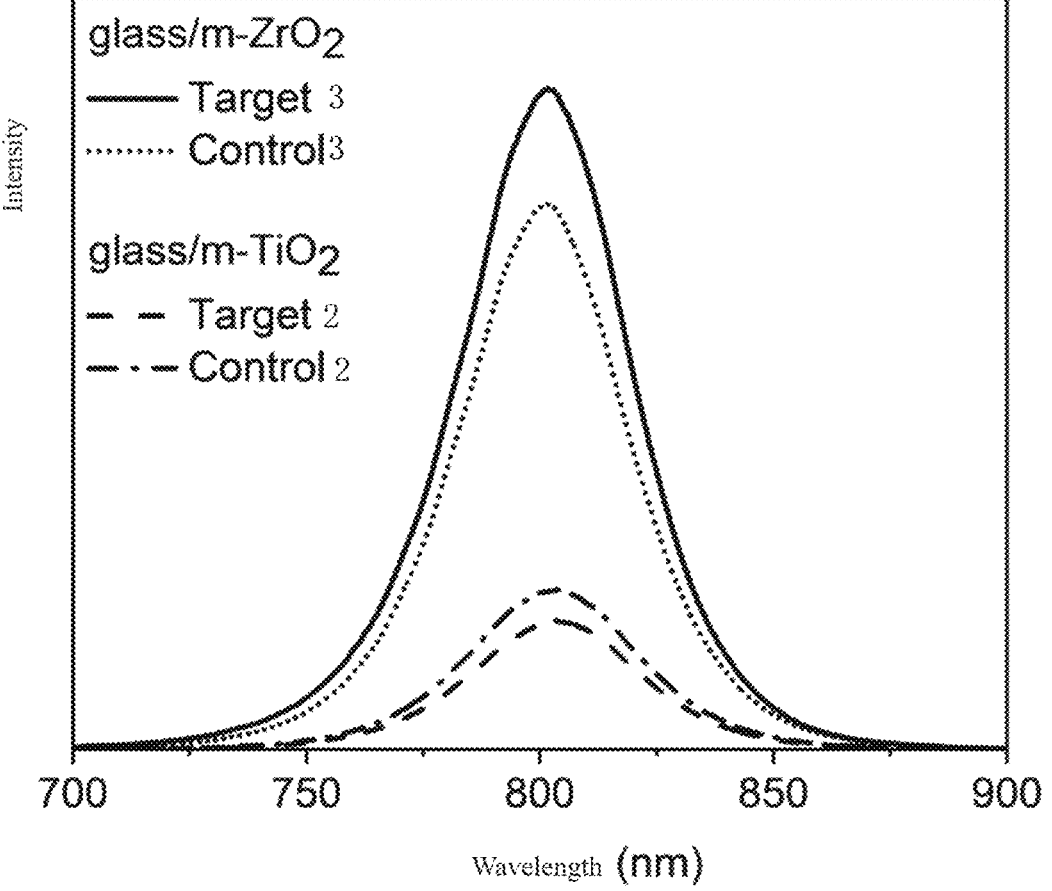
FIG. 16 is a fluorescence intensity graph of the mesoporous $TiO_2$ perovskite substrate, the TDI-processed mesoporous $TiO_2$ perovskite substrate, a mesoporous $ZrO_2$ perovskite substrate, and a TDI-processed mesoporous $ZrO_2$ perovskite substrate.

FIG. 16 shows a fluorescence intensity graph. As shown in FIG. 16, the fluorescence intensity of the TDI-processed mesoporous titanium dioxide perovskite substrate is lower than that of the mesoporous titanium dioxide perovskite substrate not processed with TDI. It means that, defects in the TDI-processed perovskite are passivated, i.e., there are fewer defects in the perovskite. Hence, more free electrons generated through illumination are absorbed by titanium dioxide, and the radiative recombination occurs for fewer electrons, thereby the fluorescence intensity is lower.

The fluorescence intensity of the TDI-processed mesoporous zirconium dioxide perovskite substrate is higher than that of the mesoporous zirconium dioxide perovskite substrate not processed with TDI. It means that, defects in the TDI-processed perovskite are passivated, i.e., there are fewer defects in the perovskite. Hence, the non-defect-induced radiative recombination occurs for more electrons, thereby the fluorescence intensity is higher.

Results of the fluorescence lifetime test are provided as follows.

Figure 17:
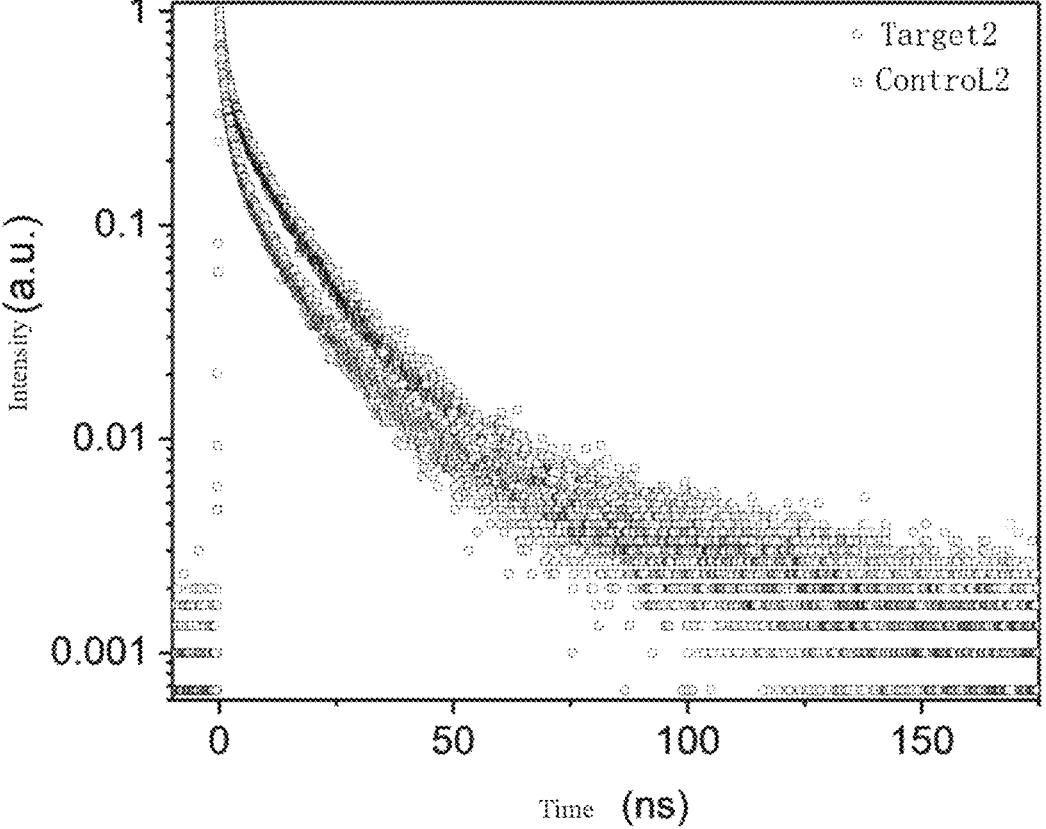
FIG. 17 is a fluorescence lifetime graph of the mesoporous $TiO_2$ perovskite substrate and the TDI-processed mesoporous $TiO_2$ perovskite substrate.

FIG. 17 shows fluorescence lifetimes of the mesoporous titanium dioxide perovskite substrate and the TDI-processed mesoporous titanium dioxide perovskite substrate.

An average fluorescence lifetime of the mesoporous titanium dioxide perovskite substrate is 6.30 ns, and an average fluorescence lifetime of the TDI-processed mesoporous titanium dioxide perovskite substrate is 3.52 ns, i.e., the fluorescence lifetime of the TDI-processed mesoporous titanium dioxide perovskite substrate is shorter, which means that there are fewer defects in the TDI-processed perovskite.

Figure 18:
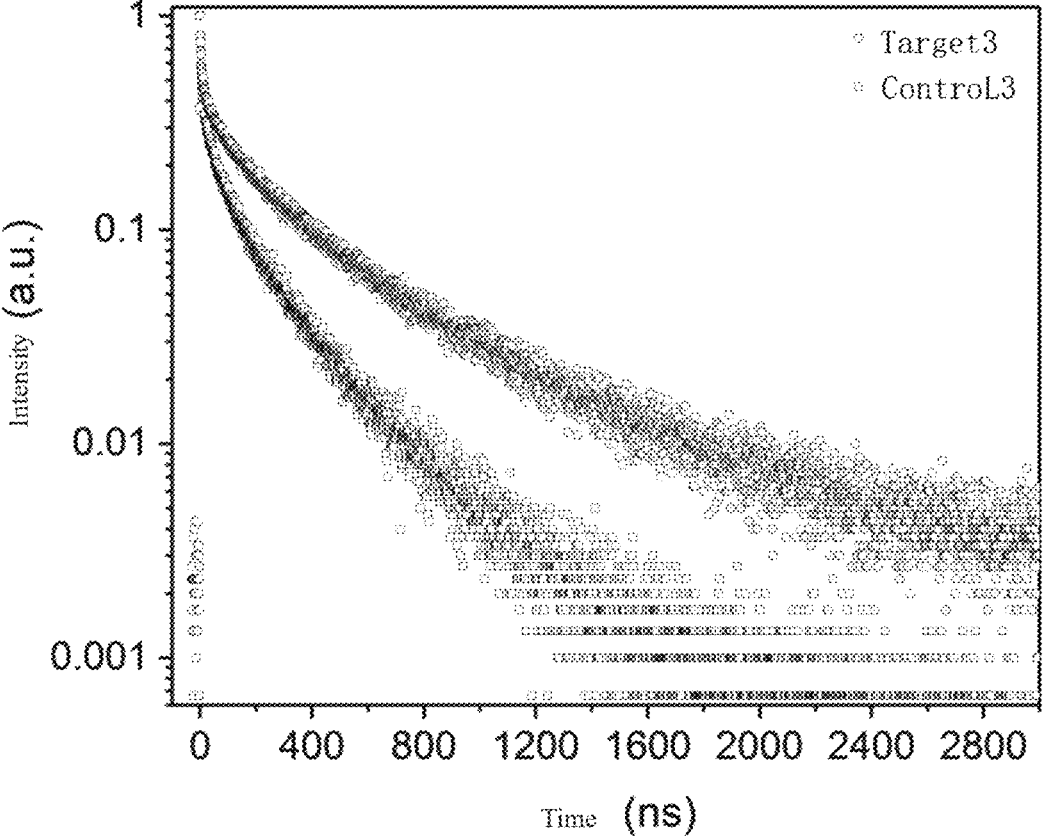
FIG. 18 is a fluorescence lifetime graph of the mesoporous $ZrO_2$ perovskite substrate and the TDI-processed mesoporous $ZrO_2$ perovskite substrate.

FIG. 18 shows fluorescence lifetimes of the mesoporous zirconium dioxide perovskite substrate and the TDI-processed mesoporous zirconium dioxide perovskite substrate.

An average fluorescence lifetime of the mesoporous zirconium dioxide perovskite substrate is 102.22 ns, and an average fluorescence lifetime of the TDI-processed mesoporous zirconium dioxide perovskite substrate is 227.04 ns, i.e., the fluorescence lifetime of the TDI-processed mesoporous zirconium dioxide perovskite substrate is longer, which means that there are fewer defects in the TDI-processed perovskite.

Fifth Embodiment

A perovskite solar cell 1 is manufactured as follows.

(1) A substrate is provided, and a conductive layer formed on the substrate. The conductive layer is made of FTO.

(2) A dense layer is formed on the conductive layer. To be specific, a dense $TiO_2$ layer is deposited on the conductive layer through spray pyrolysis.

(3) A mesoporous layer is formed on the dense layer. The mesoporous layer includes a mesoporous electron transport layer, a mesoporous interlayer and a mesoporous counter electrode layer laminated one on another on the dense layer. The mesoporous electron transport layer is a mesoporous $TiO_2$ layer, the mesoporous interlayer is a mesoporous $ZrO_2$ layer, and the mesoporous counter electrode layer is a mesoporous carbon layer.

(4) A perovskite crystal is formed on the mesoporous layer. To be specific, MAI, FAI, CsI, $PbI_2$ and MACl are added into DMF/DMSO, so as to obtain a precursor solution. Then, the precursor solution is dripped into the above-mentioned mesoporous structure, and annealed to obtain the perovskite crystal, i.e., the perovskite solar cell. The perovskite crystal is made of $Cs_{0.05}MA_{0.15}FA_{0.8}PbI_3$.

A TDI-processed perovskite solar cell 1 is manufactured as follows.

(1) A substrate is provided, and a conductive layer formed on the substrate. The conductive layer is made of FTO.

(2) A dense layer is formed on the conductive layer. To be specific, a dense $TiO_2$ layer is deposited on the conductive layer through spray pyrolysis.

(3) A mesoporous layer is formed on the dense layer. The mesoporous layer includes a mesoporous electron transport layer, a mesoporous interlayer and a mesoporous counter electrode layer laminated one on another on the dense layer. The mesoporous electron transport layer is a mesoporous $TiO_2$ layer, the mesoporous interlayer is a mesoporous $ZrO_2$ layer, and the mesoporous counter electrode layer is a mesoporous carbon layer.

(4) A perovskite crystal is formed on the mesoporous layer. To be specific, MAI, FAI, CsI, $PbI_2$ and MACl are added into DMF/DMSO, so as to obtain a precursor solution. Then, the precursor solution is dripped into the above-mentioned mesoporous structure, and annealed to obtain the perovskite crystal, i.e., the perovskite solar cell. The perovskite crystal is made of $Cs_{0.05}MA_{0.15}FA_{0.8}PbI_3$.

(5) A postprocessing solution, e.g., a chlorobenzene solution of TDI, is applied onto the perovskite crystal, so as to change the perovskite crystal into perovskite.

Figure 19:
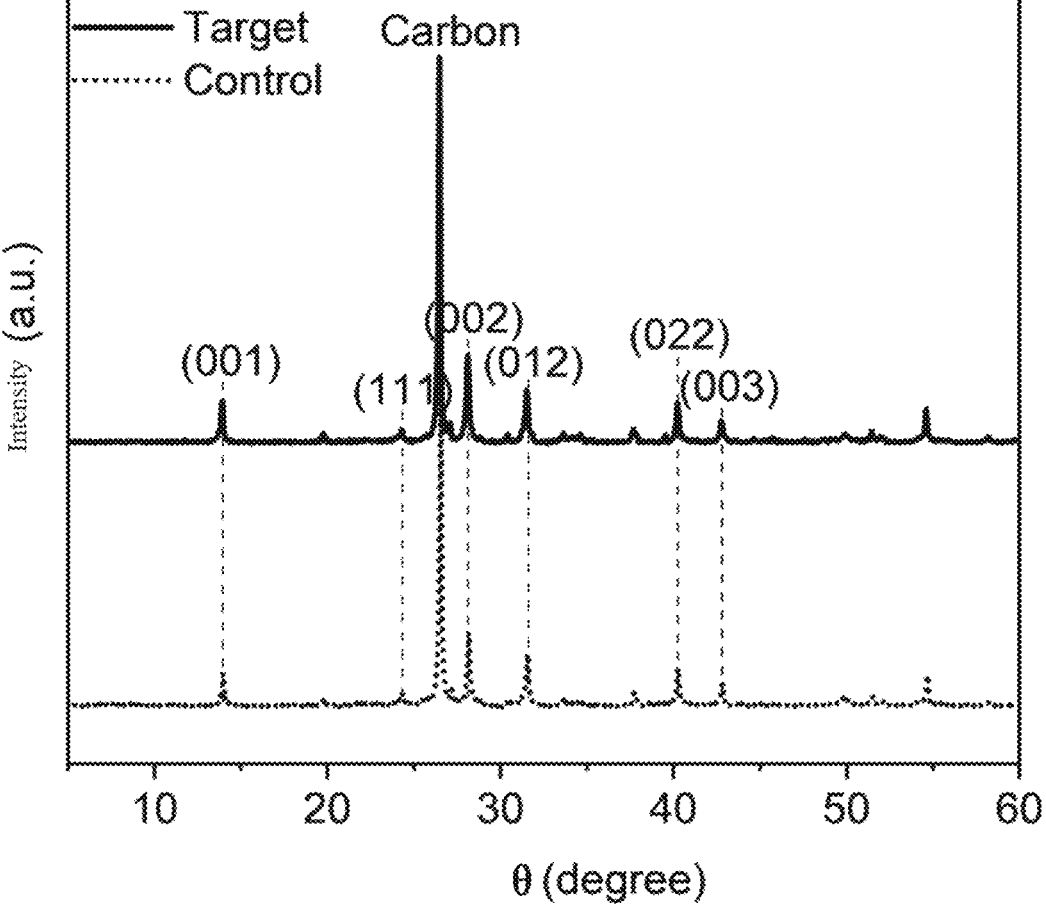
FIG. 19 is an XRD spectrogram of a perovskite solar cell and an TDI-processed perovskite solar cell.

1. The perovskite solar cell 1 (Control) and the TDI-processed perovskite solar cell 1 (Target) are subjected to an XRD test, and FIG. 19 shows an XRD spectrogram. As shown in FIG. 19, no new peak occurs for the TDI-processed perovskite solar cell, which means that a lattice structure of the perovskite crystal is not changed when it is processed with TDI.

2. The perovskite solar cell 1 and the TDI-processed perovskite solar cell 1 are subjected to a device performance test, and parameters are shown in the

TABLE 1

| | Tested device performance | | | |
|---|---|---|---|---|
| Device | Open-circuit voltage (mV) | Short-circuit current density (mA/cm²) | Fill factor | Photoelectric conversion efficiency (%) |
| Perovskite solar cell 1 | 998 | 23.32 | 0.79 | 18.38 |
| TDI-processed perovskite solar cell 1 | 1047 | 22.93 | 0.794 | 18.96 |

As shown in the Table, the open-circuit voltage, the short-circuit current density and the photoelectric conversion efficiency of the TDI-processed perovskite solar cell 1 are increased significantly.

Sixth Embodiment

A perovskite solar cell 2 is manufactured as follows.

(1) A substrate is provided, and a conductive layer formed on the substrate. The conductive layer is made of FTO.

(2) A dense layer is formed on the conductive layer. To be specific, a dense $TiO_2$ layer is deposited on the conductive layer through spray pyrolysis.

(3) A mesoporous layer is formed on the dense layer. The mesoporous layer includes a mesoporous electron transport layer, a mesoporous interlayer and a mesoporous counter electrode layer laminated one on another on the dense layer. The mesoporous electron transport layer is a mesoporous $TiO_2$ layer, the mesoporous interlayer is a mesoporous $ZrO_2$ layer, and the mesoporous counter electrode layer is a mesoporous carbon layer.

(4) A perovskite crystal is formed on the mesoporous layer. To be specific, MAI, $PbI_2$ and MACl are added into DMF/DMSO, so as to obtain a precursor solution. Then, the precursor solution is dripped into the above-mentioned mesoporous structure, and annealed to obtain the perovskite crystal, i.e., the perovskite solar cell. The perovskite crystal is made of $MAPbI_3$.

A TDI-processed perovskite solar cell 2 is manufactured as follows.

(1) A substrate is provided, and a conductive layer formed on the substrate. The conductive layer is made of FTO.

(2) A dense layer is formed on the conductive layer. To be specific, a dense TiO$_2$ layer is deposited on the conductive layer through spray pyrolysis.

(3) A mesoporous layer is formed on the dense layer. The mesoporous layer includes a mesoporous electron transport layer, a mesoporous interlayer and a mesoporous counter electrode layer laminated one on another on the dense layer. The mesoporous electron transport layer is a mesoporous TiO$_2$ layer, the mesoporous interlayer is a mesoporous ZrO$_2$ layer, and the mesoporous counter electrode layer is a mesoporous carbon layer.

(4) A perovskite crystal is formed on the mesoporous layer. To be specific, MAI, PbI$_2$ and MACl are added into DMF/DMSO, so as to obtain a precursor solution. Then, the precursor solution is dripped into the above-mentioned mesoporous structure, and annealed to obtain the perovskite crystal, i.e., the perovskite solar cell. The perovskite crystal is made of MAPbI$_3$.

(5) A postprocessing solution, e.g., a chlorobenzene solution of TDI, is applied onto the perovskite crystal, so as to change the perovskite crystal into perovskite.

The perovskite solar cell 2 and the TDI-processed perovskite solar cell 2 are subjected to a device performance test, and parameters are shown in the Table 2.

TABLE 2

| | Tested device performance | | | |
|---|---|---|---|---|
| Device | Open-circuit voltage (mV) | Short-circuit current density (mA/cm$^2$) | Fill factor | Photoelectric conversion efficiency (%) |
| Perovskite solar cell 2 | 955 | 24.54 | 0.699 | 16.37 |
| TDI-processed perovskite solar cell 2 | 998 | 24.62 | 0.733 | 18.02 |

As shown in the Table, the open-circuit voltage, the fill factor and the photoelectric conversion efficiency of the TDI-processed perovskite solar cell 2 are increased significantly.

Based on the above, the perovskite crystal in the perovskite solar cell is postprocessed with the isocyanates compound, i.e., the perovskite grain boundary is directly processed, so it is able to smooth the surface/interface and the grain boundary, passivate the defects, release the carriers and contribute to the current/voltage.

Through the in-situ reaction of the isocyanates compound at a surface/interface, it is able to smooth a bulk-phase surface potential of a perovskite crystal, change a type of a grain boundary, enhance a transportation capability of carriers at the grain boundary and a bulk phase, and attenuate the nonradiative recombination. A product of the in-situ reaction has radicals containing a lone electron pair, e.g., aminocarbonyl, and these radicals coordinate with lead in the perovskite crystal, so as to passivate an iodine vacancy defect, attenuate the nonradiative recombination, and enable an iodine vacancy to change from zero valence to monovalence. Due to the change in a valence state of the iodine vacancy, bound electrons in the grain boundary are converted into free carriers, so as to contribute to a current in a circuit of a device. In terms of the degradation stability, the product of the in-situ reaction occupies and passivates a weak degradation site, so it is able to improve the long-term stability of the perovskite solar cell.

In a word, the perovskite solar cell postprocessed with the postprocessing solution including the isocyanates compound has a high open-circuit voltage, a large fill factor and high photoelectric conversion efficiency, i.e., the perovskite solar cell manufactured through the method in the embodiments of the present disclosure has better device performance.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A method for manufacturing a perovskite solar cell, comprising:

providing a substrate;

forming a functional layer on the substrate;

forming a perovskite crystal in the functional layer;

providing a postprocessing solution comprising a solvent and an isocyanates compound; and applying the postprocessing solution to the perovskite crystal, and maintaining the postprocessing solution for a predetermined time period under a predetermined condition, so as to remove the solvent for complete reaction;

wherein the isocyanates compound is one or more selected from a group consisting of hexamethylene diisocyanate, toluene diisocynate, polyphenyl polymethylene polyisocyanate, isophorone diisocyanate and 2,4-difluorophenyl isocyanate;

wherein a volume concentration of the isocyanates compound in the postprocessing solution is 10 μl/ml to 50 μl/ml;

wherein the solvent of the postprocessing solution is an organic solvent comprising nitriles, benzenes or ethers;

wherein the maintaining the postprocessing solution for the predetermined time period under the predetermined condition comprises maintaining the postprocessing solution for 1 minute to 10 minutes at a temperature of 25° C. to 150° C.;

wherein the forming the functional layer on the substrate comprises:

forming a conductive layer on the substrate;

forming a dense layer on the conductive layer; and forming a mesoporous layer on the dense layer, the mesoporous layer comprising a mesoporous electron transport layer, a mesoporous interlayer and a mesoporous counter electrode layer laminated one on another on the dense layer;

wherein the mesoporous electron transport layer is made of one or more materials selected from a group consisting of TiO$_2$, SnO$_2$, ZnO, BaSnO$_3$ and SrTiO$_3$, the mesoporous interlayer is made of one or more materials selected from a group consisting of ZrO$_2$, SiO$_2$, Al$_2$O$_3$ and BaTiO$_3$, and the mesoporous counter electrode layer is made of one or more materials selected from carbon, ITO and FTO.

2. The method according to claim 1, wherein the perovskite crystal comprises ABX3, where A is one or more selected from a group consisting of formamidinyl (FA), methylamino (MA) and Cs, B is one or more selected from a group consisting of Pb and Sn, and X is halogen.

3. The method according to claim 2, wherein the forming the perovskite crystal comprises:

providing a perovskite precursor solution, the perovskite precursor solution being obtained through adding at least one of MAX, FAX or CsX and at least one of PbX2 or SnX2 into a solvent;

applying the perovskite precursor solution to the functional layer to form a wet perovskite film; and curing the wet perovskite film to form the perovskite crystal.

\* \* \* \* \*